United States Patent
Jung et al.

(10) Patent No.: US 6,624,080 B2
(45) Date of Patent: Sep. 23, 2003

(54) METHOD OF FABRICATING NICKEL ETCHING MASK

(75) Inventors: Sun-Tae Jung, Kyonggi-do (KR);
Duk-Yong Choi, Kyonggi-do (KR);
Joo-Hoon Lee, Kyonggi-do (KR)

(73) Assignee: Samsung Electronics Co., Ltd, Suwon (KR)

(*) Notice: Subject to any disclaimer, the term of this patent is extended or adjusted under 35 U.S.C. 154(b) by 216 days.

(21) Appl. No.: 09/906,884

(22) Filed: Jul. 17, 2001

(65) Prior Publication Data

US 2002/0009820 A1 Jan. 24, 2002

(30) Foreign Application Priority Data

Jul. 18, 2000 (KR) ........................................ 2000-40909

(51) Int. Cl.[7] .................. H01L 21/302; H01L 21/3065; B44C 1/22
(52) U.S. Cl. ................. 438/706; 438/710; 438/720; 438/725; 438/745; 216/40; 216/41
(58) Field of Search ............... 438/706, 710, 438/720, 725, 745; 216/40, 41

(56) References Cited

U.S. PATENT DOCUMENTS

| | | | | |
|---|---|---|---|---|
| 4,350,564 A | * | 9/1982 | Wei | 156/659.1 |
| 4,902,607 A | * | 2/1990 | Lee | 438/323 |
| 4,983,250 A | * | 1/1991 | Pan | 156/628 |
| 5,277,749 A | * | 1/1994 | Griffith et al. | 156/643 |
| 6,020,261 A | * | 2/2000 | Weisman | 438/669 |
| 6,068,781 A | * | 5/2000 | Tsuruma | 216/13 |
| 6,497,995 B2 | * | 12/2002 | Skrobis | 430/323 |

FOREIGN PATENT DOCUMENTS

| | | | | |
|---|---|---|---|---|
| GB | 1174763 A2 | * | 7/2001 | G03F/1/08 |
| JP | 20020822246822 | * | 3/2002 | G02B/6/13 |

OTHER PUBLICATIONS

Jung et al., Method for Manufacturing Optical Waveguide, Mar. 22, 2002, English Abstract of JP 20002082246 A, 1 page.*

* cited by examiner

Primary Examiner—Benjamin L. Utech
Assistant Examiner—Lynette T. Umez-Eronini
(74) Attorney, Agent, or Firm—Cha & Reiter

(57) ABSTRACT

There is provided a metal etching mask fabrication method. Chrome is first sputtered on a silica layer and a photoresist, which is thicker than the chrome layer, is deposited on the chrome layer. The photoresist layer is patterned, a first nickel is sputtered on the photoresist pattern layer and onto a first portion of the chrome layer exposed by the patterning. A second nickel layer is formed on the portions of the first nickel layer in contact with the first portion of the chrome layer by electroplating. The photoresist pattern has side walls having acute angles to prevent contact between the first nickel layer on the photoresist and the second nickel layer on the first portion of the chrome layer. The photoresist pattern layer and the first nickel layer formed on the photoresist pattern layer are removed using a solvent, and the chrome layer is removed by dry etching in plasma using a gas.

20 Claims, 5 Drawing Sheets

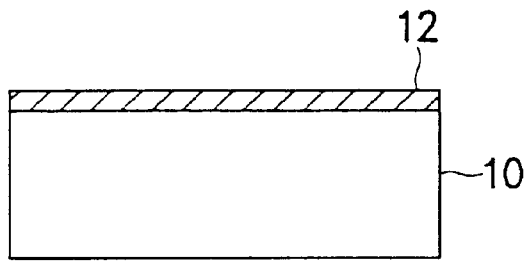
FIG. 1A [PRIOR ART]
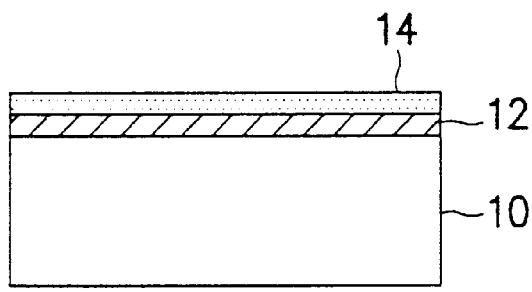
FIG. 1B [PRIOR ART]
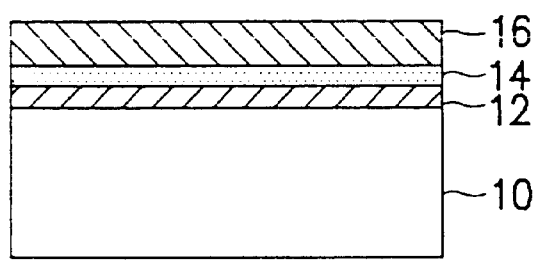
FIG. 1C [PRIOR ART]

METHOD OF FABRICATING NICKEL ETCHING MASK

CLAIM OF PRIORITY

This application makes reference to and claims all benefits accruing under 35 U.S.C. Section 119 from an application entitled, "Method of Fabricating Nickel Etching Mask," filed in the Korean Industrial Property Office on Jul. 18, 2000 and there duly assigned Ser. No. 2000-40909.

BACKGROUND OF THE INVENTION

1. Field of the Invention

The present invention relates generally to a light waveguide fabrication method, and in particular, to a method of fabricating a nickel etching mask by plating for manufacture of a silica PLC (Planar Lightwave Circuit).

2. Description of the Related Art

Many studies have recently been focused on optical integration technology, and more particularly, to a method of manufacturing optical waveguide chip, which contain one or more planar waveguides, or known as Planar Lightwave Circuits. PLCs are used as optical components for the purpose of optical signal processing, such as modulation, switching, and multiplexing of optical signals. The production of optical waveguides device involves designing, manufacture, and packaging of the optical waveguides. Optical fibers are connected to the planar optical waveguides to function as an optical component in an optical communication system. To this end, an optical waveguide is an optical transmission line keeping light waves and propagating them with low loss. The optical waveguide is comprised of a core with a high refractive index and a cladding with a low refractive index surrounding the core. As such, optical fibers connected to the planar optical waveguides formed in the PLC serves as Arrayed Waveguide Gratings (AWGs) and thermal optical switches. A metal mask is usually used to fabricate a PLC for an optical communication module. Basically, the metal mask is formed by sputtering of a metal layer, photoresist patterning, and dry etching operations.

FIGS. 1A to 1G are cross-sectional views illustrating the conventional metal etching mask fabrication method for use in the manufacturing of a PLC.

FIG. 1A illustrates the step of depositing chrome on a silica layer 10, which is formed by depositing silica ($SiO_2$) on silicon (Si), by sputtering process. A chrome seed layer 12 is formed to a thickness of tens of nanometers (nm) on a substrate 10. FIG. 1B illustrates the step of depositing gold on the chrome seed layer 12 by sputtering process. The thickness of a gold seed layer 14 is the tens of nanometers. FIG. 1C illustrates the step of forming a photoresist layer 16 to be relatively thick on the chrome seed layer 12. FIG. 1D illustrates the step of patterning the photoresist layer 16 by photolithography. FIG. 1E illustrates the step of forming a nickel layer 18 by plating nickel on photoresist patterns 17. The nickel layer 18 grows selectively only on conductive portions. FIG. 1F illustrates the step of removing the photoresist patterns 17 using acetone. FIG. 1G illustrates the step of removing the gold seed layer 14 by wet etching, as well as the chrome seed layer 12 by dry etching.

The nickel layer 18 exhibits low electrical conductivity and low thermal conductivity with the substrate 10. Therefore, it is difficult to use the nickel layer 18 as a seed layer. Instead, a chrome layer 12 with high electrical conductivity, in addition to high thermal conductivity, 10 is preferably to be used as a seed layer. In addition, when nickel layer 18 is plated on the chrome seed layer 12, the surface between the nickel layer 18 and the chrome seed layer 12 exhibits low conductivity. To solve this problem, the gold layer 14 having high junction characteristics with both the chrome and the nickel is interposed between the nickel layer 18 and the chrome layer 12. As a result, the use of the different seed layers (i.e., the chrome layer 12 and the gold layer 12) makes the fabrication process more complexity as a separate requirement of dry etching and wet etching is required in the conventional etching mask fabrication method.

Deposition of the two seed layers and particularly, different removal operation of the seed layers after plating process complicates the operation and increases the processing time. The process is more cumbersome as the gold layer 14 may require cleansing when isotropically etched by wet etching. Furthermore, because the barrel etcher provides a purely isotropic etch as shown in FIG. 1D, there is poor dimensional control when etching a number of photoresist bodies in an array due to the so-called "bulls-eye" effect in which structures at the edges of array are etched more rapidly than the structure towards the center of the array. Hence, the "bull's-eye" effect during the dry etching process may change the line widths of patterns across the substrate.

SUMMARY OF THE INVENTION

It is, therefore, the present invention relates to a method of fabricating an etching mask with nickel plated on a chrome seed layer and a nickel seed layer.

It is another aspect of the present invention is to provide a nickel etching mask fabrication method for simplifying processing.

It is a further aspect of the present invention is to provide a nickel etching mask fabrication method for minimizing the possibility of contamination.

The foregoing and other objects can be achieved by providing a metal etching mask fabrication method. Chrome is first sputtered on a silica layer and a photoresist is deposited to be thick on the chrome layer. The photoresist layer is patterned, first nickel is sputtered on the photoresist pattern layer, and a second nickel layer is formed on the first nickel layer by electroplating. The photoresist pattern layer and the first nickel layer formed on the photoresist pattern layer are removed using acetone, and the chrome layer is removed by dry etching in plasma using a gas.

BRIEF DESCRIPTION OF THE DRAWINGS

A more complete understanding of the method and apparatus of the present invention may be had by reference to the following detailed description when taken in conjunction with the accompanying drawings wherein:

FIGS. 1A to 1G are sectional views sequentially illustrating a conventional etching mask fabrication method; and, FIGS. 2A to 2G are sectional views sequentially illustrating a nickel etching mask fabrication method according to an embodiment of the present invention.

DETAILED DESCRIPTION OF THE PREFERRED EMBODIMENT

A preferred embodiment of the present invention will be described hereinbelow with reference to the accompanying drawings. For the purpose of clarity and simplicity, well-known functions or constructions are not described in detail as they would obscure the invention in unnecessary detail.

Typically, electroplating of nickel is applied to fabricate an array of microelectro—mechanical system (MEMS) elements as a part of microwave circuit. Anna Massimi, et al., *Fabrication of Optical Wave-Guides in Silica-on-Silicon by Nickel Electroplating and Conventional Reactive Ion Etching*, Jpn. J. Appl. Phys. Vol 38 (1999), pps 6150–6153, Part 1, No. 10, October 1999 introduced this technique for etching of optical waveguides. In accordance with the present invention, the nickel-plating technique facilitates the fabrication of a relatively thick metal mask and removes the Bull's eye effect generated during dry etching An etching mask fabricating method according to the present invention will be described referring to FIGS. 2A to 2G.

Figure 1D:
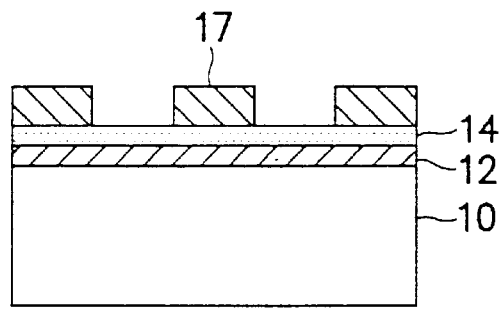
Figure 1E:
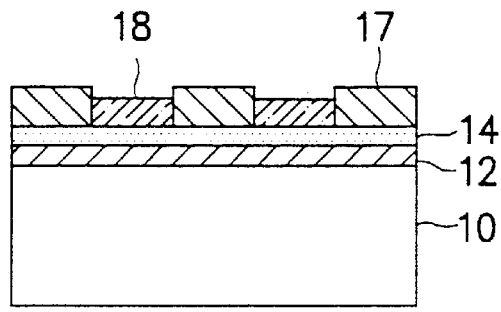
Figure 1F:
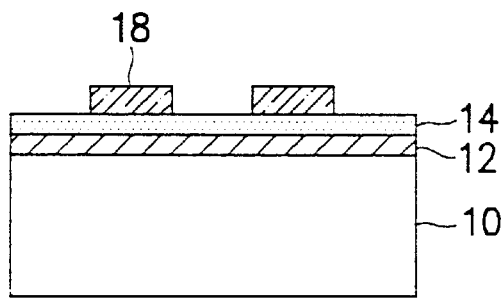
Figure 1G:
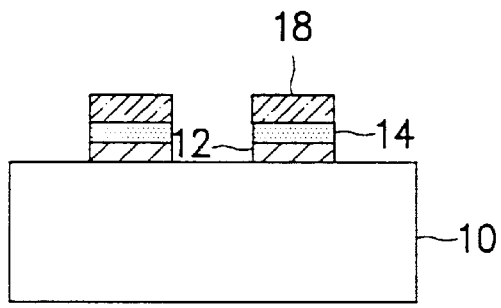
Figure 2A:
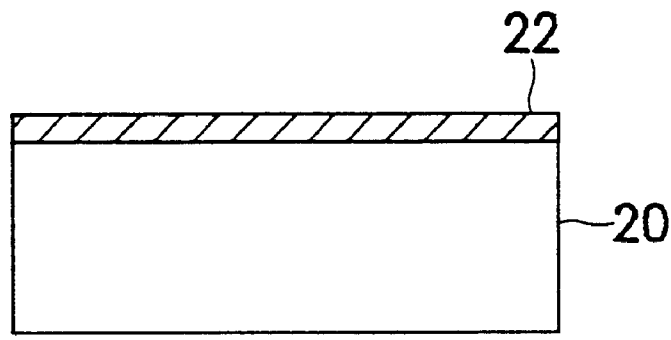

Referring to FIG. 2A, a silica layer 20 is deposited on a planar substrate, particularly a planar silicon substrate and a chrome seed layer 22 is uniformly deposited on the silica layer 20 to a thickness ranging from tens of nanometers to 100 nm.

Figure 2B:
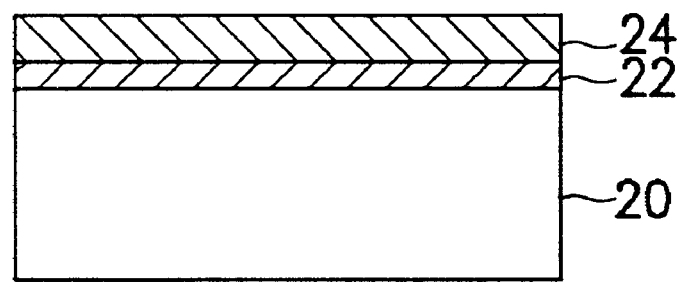

Referring to FIG. 2B, a photoresist layer 24 is formed on the chrome seed layer 22 which is thicker than the chrome seed layer 22. The photoresist layer 24 can be formed by depositing several ml of a photoresist material on the chrome layer of the substrate and providing high speed rotation at a spin station to disperse the material uniformly as a coating of photoresist which is several um thick. Thus, the thickness of the photoresist layer (um) is relatively thicker than the thickness of the chrome seed layer (nm). It is understood by persons of ordinary skill in the art that the present invention is not limited by the explanation of one way that a photoresist layer may be deposited on a substrate. For example, while dispersing the photoresist by spinning is preferred, it could be possible to use a ambient static bath provided that the end result provides a coating of photoresist layer having the approximate thickness specified above.

Figure 2C:
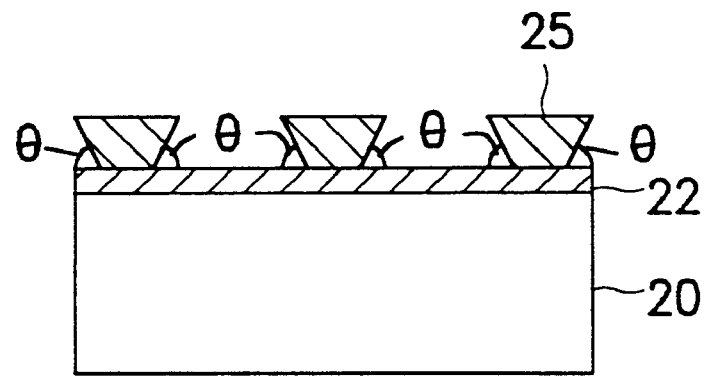

Referring to FIG. 2C, a photoresist pattern layer 25 is formed by soft-baking the photoresist layer 24 at approximately 100° C. for one minute and after exposure of the photoresist via a mask pattern, immersing the photoresist in a chlorobenzene solution to remove the solvent and solidify the layer. Here, the side angles of the photoresist pattern layer 25 with the chrome seed layer 22 are acute when measured from an outer portion of the sidewall to a first portion of the chrome which is exposed due to the patterning. By the photoresist pattern having sidewalls with acute angles, a nickel seed layer comprising nickel seed layer 26 and nickel seed layer 27, is sputter deposited on the photoresist pattern layer 25. The nickel seed layer 26 deposited on the photoresist is not electrically connected to the nickel seed layer 27 deposited on the chrome seed layer 22. (see FIG. 2D).

In other words, the nickel layer 26, and the nickel layer 27, are sputter deposited in one step, and the nickel layer 26 is deposited on the photoresist pattern layer 25 and the nickel seed layer 27 is deposited on the chrome layer 22. The reason that nickel layer 27 is deposited on directly on the chrome layer 22 is because of the portions of the photoresist 24 were removed during the patterning process, leaving areas of chrome exposed. The deposit of the nickel layer 26 on the photoresist pattern layer will make it difficult to remove the photoresist pattern layer 25 if there is electrical contact between the layer 26 and layer 27 because this contact would permit elctroplate depositing of even more nickel to occur on top of the nickel layer 26 on the photoresist pattern layer 25 in a subsequent nickel-plating step.

Figure 2D:
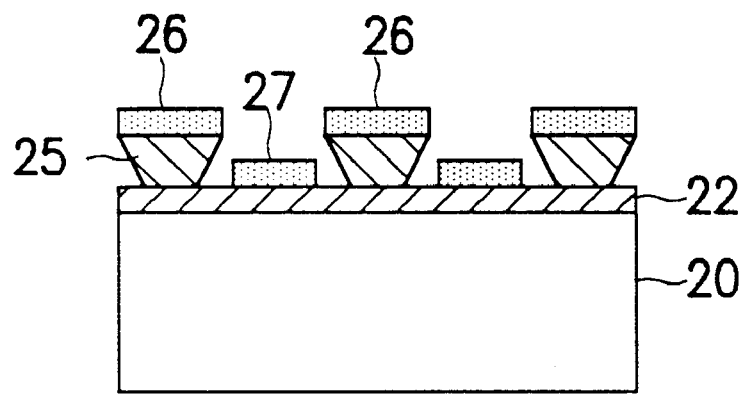

Referring to FIG. 2D, the first nickel seed layer 26 is deposited on the photoresist pattern layer 25 and the first nickel seed layer 27 are deposited according to a predetermined width of the chrome seed layer 22 between photoresist patterns by sputtering.

Figure 2E:
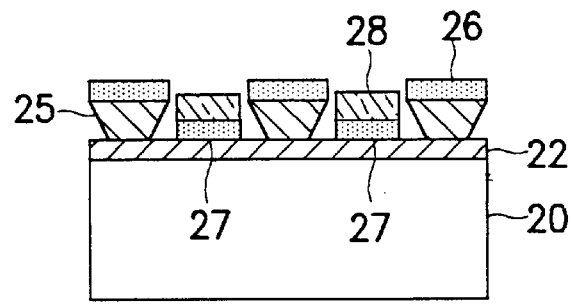

Referring to FIG. 2E, a second nickel layer 28 is electroplate deposited only onto the first nickel seed layer 27 that are in electrical contact with the chrome layer 22. As electroplating requires a conductive path from anode to cathode, the photoresist pattern blocks the conduction of current to the nickel 26 deposited on the photoresist pattern 25, so the second nickel layer is only electroplate deposited on first nickel layer 27 (and not on layer 26), because nickel layer 27 has an electrically conductive path to the chrome layer.

Figure 2F:
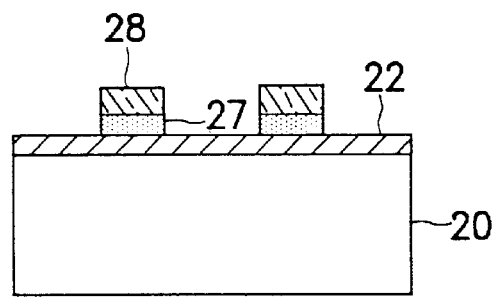

Referring to FIG. 2F, the photoresist pattern layer 25 is removed along with the overlying first nickel seed layer 26 using a solvent. While acetone was used, other known solvents appropriate for photoresist stripping, such as N-Methyl Pyrrolidone (NMP) may also be used.

Figure 2G:
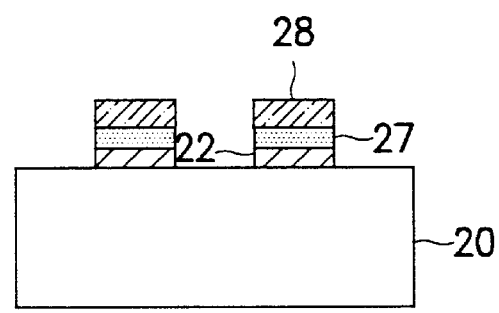

Referring to FIG. 2G, the chrome seed layer 22 is dry-etched in plasma at 100 to 500 W with 50 to 2000 nTorr using a $Cl_2+O_2$ gas by RIE (Reactive Ion Etching).

Consequently, the photoresist pattern layer 25 and the first nickel seed layer 26 are removed together by a single etching step, thereby reducing the number of processes.

Thus, as shown in the final step in FIG. 2G, there remains a nickel layer 28 which has been electroplated onto first nickel layer 27, which was sputter deposited on chrome layer 27. The present invention eliminates the use of gold between a nickel layer and a chrome layer, which reduces costs, and provides for better matching of thermal conductivity. In addition, the elimination of the use of gold as a seed layer between the nickel and the chrome seed layer eliminates separate removal processes for each metal, as the gold is removed by wet etching and the chrome by dry etching. Thus, a more efficient process is provided by the present invention.

In accordance with the present invention as described above, a relatively thick metal mask is easily fabricated by plating, and the Bull's eye effect produced during dry etching is eliminated. While the conventional plating method has the problem of process complexity due to deposition of two seed layers, the process according to the present invention is simplified, and time is saved in fabricating an etching mask according to the present invention. In addition, since wet etching is not performed, cleansing is omitted, thereby reducing the possibility of contamination.

While the invention has been shown and described with reference to a certain preferred embodiment thereof, it will be understood by those skilled in the art that various changes in form and details may be made therein without departing from the spirit and scope of the invention as defined by the appended claims. For example, while a chrome layer and nickel layers are illustrated, it is within the spirit of the invention and the scope of the appended claims to use a first metal and a second metal other than chrome and nickel, although the best results known to the inventors are by using these particular metals. The relative thicknesses of the photoresist layer to the chrome layer (or first metal layer) can also be varied.

What is claimed is:

1. A metal etching mask fabrication method comprising the steps of:

(a) sputtering a chrome layer on a silica layer;

(b) depositing a photoresist on the chrome layer which is thicker than the chrome layer;

(c) patterning the photoresist layer;

(d) sputtering a first nickel layer on the photoresist pattern layer and onto a first portion of the chrome layer having its surface exposed by the patterning performed in step (c);

(e) forming a second nickel layer on the first nickel layer deposited onto the first portion of the chrome layer by electroplating;

(f) removing the photoresist pattern layer and the first nickel layer formed on the photoresist pattern layer using a solvent; and, (g) removing a second portion of the chrome layer by dry etching in plasma using a gas, said second portion of the chrome layer having its surface exposed by the removing of the photoresist pattern layer and first nickel layer recited in step (f).

2. The metal etching mask fabrication method of claim 1, wherein a thickness of the chrome layer is several um and a thickness of the photoresist layer ranges from approximately 10 to 100 nm.

3. The metal etching mask fabrication method of claim 1, wherein the patterning of the photoresist layer in step (c) includes patterning sidewalls having acute side angles of the photoresist relative to a surface of the chrome layer.

4. The metal etching mask fabrication method of claim 1, wherein, the solvent used in step (f) is acetone.

5. The metal etching mask fabrication method according to claim 1, wherein the solvent used in step (f) is N-Methyl Pyrrolidone (NMP).

6. The metal etching mask fabrication method of claim 1, wherein the patterning of the photoresist layer in step (c) includes form an angle in the sidewalls by immersing at least a portion of the photoresist layer in a chlorobenzene solution.

7. The metal etching fabrication method according to claim 1, wherein the the first nickel layer sputtered on the first portion of the chrome layer in step (d) and the second nickel layer formed in step (e) are not in electrical contact with each other.

8. The metal etching mask fabrication method of claim 1, wherein the dry etching of the chrome layer recited in step (g) is performed at 100 to 500W.

9. The metal etching mask fabrication method of claim 1, wherein the dry etching of the chrome layer recited in step (g) is performed at a pressure of 50 to 200 mTorr.

10. The metal etching mask fabrication method of claim 1, wherein the gas used for the dry etching of the chrome layer is $Cl_2+O_2$.

11. A metal etching mask fabrication method comprising the steps of:

(a) sputtering a first metal layer on a silica layer;

(b) depositing a photoresist on the first metal layer which is thicker than the first metal layer;

(c) patterning the photoresist layer;

(d) sputtering a first layer of a second metal on the photoresist pattern layer and onto a first portion of the first metal layer having its surface exposed by the patterning performed in step (c);

(e) forming a second layer of the second metal deposited onto the first portion of the first metal by electroplating;

(f) removing the photoresist pattern layer and the first layer of the second metal layer formed on the photoresist pattern layer using a solvent; and, (g) removing a second portion of the first metal by dry etching in plasma using a gas, said second portion of the first metal having its surface exposed by the removing of the photoresist pattern layer and first layer of the second metal recited in step (f).

12. The metal etching mask fabrication method of claim 1, wherein a thickness of the first metal layer is several um and a thickness of the photoresist layer ranges from approximately 10 to 100 nm.

13. The metal etching mask fabrication method of claim 1, wherein the patterning of the photoresist layer in step (c) includes patterning sidewalls having acute side angles of the photoresist relative to a surface of the first metal layer.

14. The metal etching mask fabrication method of claim 1, wherein, the solvent used in step (f) is acetone.

15. The metal etching mask fabrication method according to claim 1, wherein the solvent used in step (f) is N-Methyl Pyrrolidone (NMP).

16. The metal etching mask fabrication method of claim 1, wherein the patterning of the photoresist layer in step (c) includes form an angle in the sidewalls by immersing at least a portion of the photoresist layer in a chlorobenzene solution.

17. The metal etching fabrication method according to claim 1, wherein the first layer of the second metal sputtered on the first portion of the first metal layer in step (d) and the second layer of the second metal formed in step (e) are not in electrical contact with each other.

18. The metal etching mask fabrication method of claim 1, wherein the dry etching of the first metal layer recited in step (g) is performed at 100 to 500 W.

19. The metal etching mask fabrication method of claim 1, wherein the dry etching of the first metal layer recited in step (g) is performed at a pressure of 50 to 200 mTorr.

20. The metal etching mask fabrication method of claim 1, wherein the gas used for the dry etching of the first metal layer is $Cl_2+O_2$.

* * * * *